Oct. 5, 1965 J. PHILIPS ETAL 3,210,696

BRIDGED-T FILTER

Filed Feb. 10, 1961 3 Sheets-Sheet 1

WITNESSES
John C. Heasley, Jr.
James F. Young

INVENTORS
John Philips &
Charles E. Benjamin
BY N. J. Brodahl
ATTORNEY

BRIDGED-T FILTER

Filed Feb. 10, 1961 3 Sheets-Sheet 3

United States Patent Office 3,210,696
Patented Oct. 5, 1965

3,210,696

BRIDGED-T FILTER

John Philips, Pittsburgh, and Charles E. Benjamin, Penn Hills, Pa., assignors to Westinghouse Electric Corporation, East Pittsburgh, Pa., a corporation of Pennsylvania

Filed Feb. 10, 1961, Ser. No. 88,436
6 Claims. (Cl. 333—70)

The present invention relates to bridged-T filters, and more particularly to semiconductor tuned filters with a narrow band rejection characteristic, which are constructed in a monolithic form.

Selectively is normally obtained in electronic systems by means of inductor and capacitor (LC) tuned circuits. When devices such as frequency selective amplifiers and filter circuits are to be constructed from solid state materials in accordance with molecular engineering concepts, the problem arises of creating the frequency selectivity without the use of LC tuned circuits. This is necessary because at the present time the inductive characteristic is not readily obtained in a monolithic structure.

As is well known in the communications art, there are a number of circuits for obtaining frequency selectivity which employ only resistance and capacitance. Some of the better known of these are the Wien bridge, the twin-T and the bridged-T null networks; other frequency selective RC circuits are described in the literature.

The bridged-T network configuration is readily adaptable to be used in a monolithic or molecular block form because of its relative simplicity of fabrication, tunability over a wide range and having limited matching requirements. A distributed RC network in a monolithic form can be obtained by back biasing a p-n junction of a two region semiconductor structure. The magnitude of the distributed capacitance of the network is dependent on the bias potential. To complete the bridged-T filter network a lumped "leg" resistor must be provided, and for proper operation the lumped resistor must be matched to the distributed resistance of the distributed RC network. It has been suggested in the prior art to provide the matched lumped resistor as an external resistor (external to the monolithic structure) or to add additional resistive layers to the monolithic structure. The former, however, is larger and not monolithic in structure, and the latter is considerably more complex to fabricate. The latter design may also have an unwanted parallel capacitance with the lumped resistor.

In copending application, Ser. No. 5,045 for "Narrow Band Rejection Filter and Tunable Monolith for Use Therein," filed Jan. 27, 1960, in the name of William M. Kaufman, and assigned to the assignee of this application, there is described and claimed a novel distributed bridged-T filter network in which a distributed resistance and capacitance is combined with a lumped, or non-distributed resistive impedance, to provide a tunable notch filter which is capable of being easily and simply tuned over a wide range of frequencies by the adjustment of the ratio of the distributed resistance to the nondistributed resistance and/or by changing the distributed capacitance. The present invention relates to an improved particular embodiment of the invention in the Kaufman application.

In another copending application, Ser. No. 64,854 for "Narrow Band Notch Filter," filed Oct. 25, 1960, in the names of John B. Husher and Salvatore L. Iannazzo, and assigned to the assignee of this application, there is described and claimed a further specific improvement upon the monolithic distributed bridged-T monolithic filter network incorporating the basic concepts of the Kaufman application. Although filed later, the present application is prior in conception to the embodiment disclosed in the Husher et al. application. The novel construction of the present application embodies a special p-n junction semiconductor device having ohmic contacts arranged in a special manner to provide a readily tunable notch filter when it is biased in one particular manner. The Husher et al. construction comprises a p-n-p semiconductor monolithic device, effectively providing rectifying p-n junctions connected back-to-back so that it may be connected to any input or output circuit directly, one junction always being forward biased while the other is reverse biased regardless of the polarity of the external circuit connections.

The present invention is generic to the embodiment shown in the Husher et al. application and teaches the p-n junction arrangement where one surface can be readily etched to produce a wide range of distributed resistance, and therefore a wide range of tuning, in combination with an integral extension on the other region of the semiconductor device which has a common input-output terminal electrically separated from a large ohmic contact, which is substantially coextensive with the p-n junction, to give the necessary lumped impedance. As is pointed out in the Kaufman application, as well as in this application and the Husher et al. application, the manner in which the ratio of the distributed resistance to the non-distributed resistance can be varied without simultaneously effecting the distributed capacitance constitutes a salient feature of these applications.

It is therefore an object of the present invention to provide an improved narrow band rejection filter employing a monolithic frequency selective structure.

It is a further object of the present invention to provide an improved narrow band rejection filter employing a monolithic structure in which the need for a separate lumped resistor is eliminated, thereby accomplishing fabrication and size advantages.

These and other objects of the present invention will become more clearly apparent from a study of the following specification when read in connection with the accompanying drawings, in which.

Broadly, the present invention provides a semiconductor narrow band rejection filter device including two regions of different type semiconductivity separated by a p-n junction, which is reverse biased, a pair of terminals spaced apart on a surface device adjacent one of the regions, and another pair of terminals spaced a predetermined distance apart on another surface of the device adjacent the other region of different type semiconductivity; the regions of different type semiconductivity having a predetermined impurity concentration distribution.

The semiconductive material employed may be silicon, germanium, silicon carbide or a stoichiometric compound comprised of elements from Group III of the Periodic Table, for example, gallium, aluminum and indium, and elements from Group V, for example, arsenic, phosphorus and antimony. Examples of suitable III–V stoichiometric compounds include gallium arsenide, gallium antimonide, indium arsenide, and indium antimonide.

The filter device will be discussed in a particular p-type and n-type configuration. However, it is to be understood that these regions may be interchanged.

Figure 1:
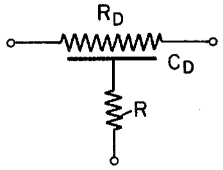
FIGURE 1 is a schematic diagram of a bridged-T filter network.

FIG. 1 shows a schematic diagram of a bridged-T filter network wherein there is a distributed resistance $R_d$ incrementally connected to a distributed capacitance $C_d$. The common terminal of the distributed capacitance $C_d$ is connected to the "leg" or lumped resistance R of the bridged-T. In order to provide proper functioning of the filter network the distributed resistance $R_d$ and the lumped resistance R are matched. This equivalent bridged-T filter network is herein provided in a monolithic structure, as explained below.

Figures 2, 3:
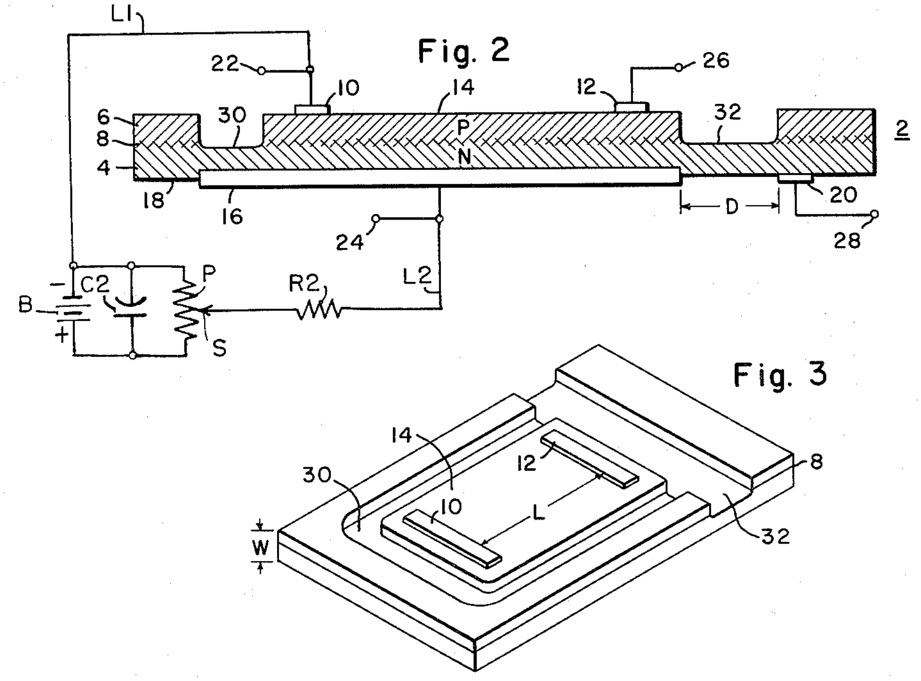
FIG. 2 is a side view in cross section of a narrow band rejection filter according to the present invention.
FIG. 3 is a top isometric view of the filter device.

In FIG. 2 there is shown a single crystal wafer 2 of an n-type semiconductivity, for example silicon, which has been diffused with a p-type doping material such as indium, gallium, aluminum, or boron to form an n-type region 4 and a p-type region 6. A p-n junction 8 is formed between regions 4 and 6. Ohmic contacts 10 and 12 are fused to surface 14 of device 2 adjacent p-type region 6. A broad area ohmic contact 16 is fused to a surface 18 of the device adjacent the n-type region 4. Separated a predetermined distance D from contact 16 on the surface 18 is fused an ohmic contact 20. Terminals 22, 24, 26 and 28 are connected to contacts 10, 16, 12 and 20, respectively. The ohmic contacts may comprise ohmic solders, molybdenum, tungsten, tantalum, or alloys of gold or silver, for example.

Suitable means, such as a battery B and a potentiometer P having a slider S, may be connected to leads L1 and L2 between one ohmic contact on one semi-conductor region and another ohmic contact on the other region of the p-n junction for the purpose of reverse biasing the junction. As illustrated, the negative terminal of battory B is connected through lead L1 to ohmic contact 10 and the slider S is connected through lead L2 to the ohmic contact 16. As is well understood by those skilled in the art it would be preferable, although not absolutely essential, that a resistor R2 having a resistance value in the neighborhood of 100K be inserted in the biasing circuit in order not to unduly load the input circuit of the filter. Likewise it would be apparent to those skilled in the art that preferably a suitable condenser C2 be connected in parallel across the battery in order to minimize any variation in the input impedance when the slider S is adjusted on the potentiometer. It should be pointed out here that none of the details of the biasing circuit constitute any part of the present invention. The biasing circuit, which could be supplied by anyone skilled in the art, is merely illustrated for the purpose of showing a completed circuit means for reverse biasing the p-n junction.

The biasing circuit in FIG. 2 is only for illustrative purposes since it is understood by those skilled in the art that the reverse bias could be applied between the ohmic contact 10 and either of the ohmic contacts 16 or 20 of the other region of semiconductivity or could be applied between ohmic contact 12 on the first semiconductor region and either contact 16 or 20 on the other region.

Referring also to FIG. 3, a U-shaped trough 30 is etched into surface 14 to a depth deeper than the level of the p-n junction 8. A trough 32 is etched in surface 14 across the width of device 2. The contacts 10 and 12 are shown disposed a distance L apart on the surface 14.

Figure 4:
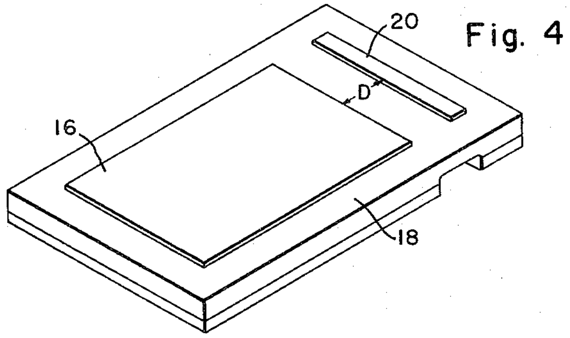
FIG. 4 is a bottom isometric view of the filter device.

FIG. 4 shows the bottom surface 18 of device 2 with ohmic contact 16 disposed on the surface, and ohmic contact 20 disposed a predetermined distance D from contact 16 on the same surface 18. The distance D along with the width and thickness of the device determines the resistance R, which is to be matched to the distributed resistance of the filter device, as explained later.

Figure 5:
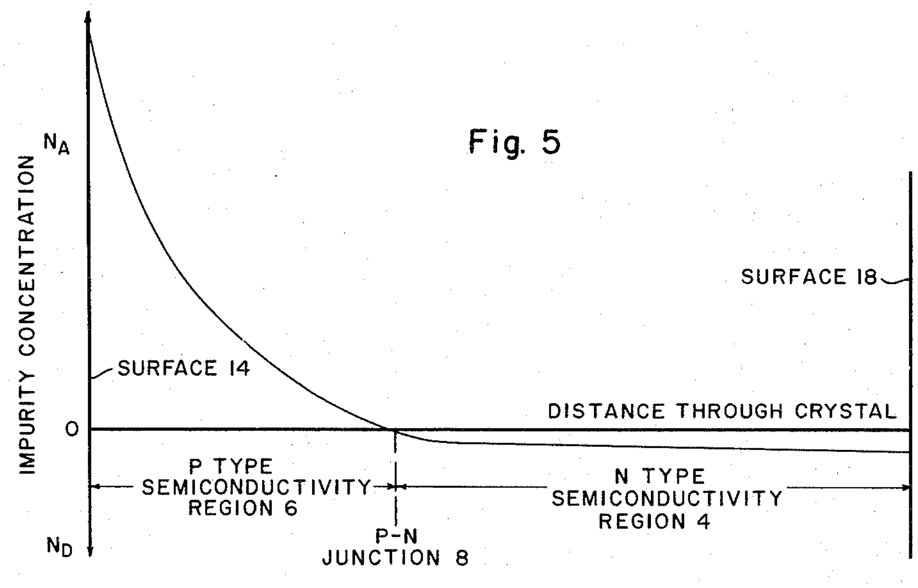
FIG. 5 is a plot of the impurity concentration of the filter device as a function of the depth of the device.

In FIG. 5 the impurity concentration $N_a$ (number of acceptors) and $N_d$ (number of donors) through the device 2 is shown plotted between the top surface 14 and the bottom surface 18. Due to the diffusion of the p-type acceptor impurity material into the n-type material there is a high acceptor concentration near the surface 14 which rapidly decreases with depth until at the p-n junction 8 there is a zero net concentration level. In the n-type semiconducting region the donor impurity concentration reaches a substantially constant level at a depth slightly past the p-n junction 8 and continues at this concentration to the bottom surface 18. Because of the rapid decrease of impurity concentration in the p-type region with depth near the surface 14, the resistance between the contacts 10 and 12 can readily be controlled by etching or otherwise removing controllably the top surface 14. As the lowest resistivity region is always adjacent the surface available for etching, the impurity distribution created by the diffusion process permits a wide range of frequencies to be utilized. This is in contrast to a uniform impurity distribution where it would be required to remove the region to a depth directly proportional to the decrease in the conductivity desired.

To tune and match the filter device so that it will function as a symmetrical network, the distributed RC network alone is first tested for its notch or null frequency with a constant reverse bias potential and by using an external lumped resistor. The surface 14 between the contacts 10 and 12 can be etched down to increase the distributed resistance to select the desired frequency. The desired frequency can be further adjusted by varying the distributed capacitance with the bias potential, not shown. Removing the external lumped resistor, the internal lumped resistance R of the n-type region 4 between contacts 16 and 20 is matched to the distributed resistance $R_d$ by etching the surface 18, between the contacts 16 and 20 if the resistance is too low or fusing shorting foils into this region if it is too high. As it is desirable to use an etching process, the lumped resistance R is generally designed to be too low and then increased by etching in order to match the distributed to the lumped resistance. Thus, the lumped resistance R may be accurately matched to the already fabricated distribution resistance $R_d$.

In explaining the operation of the filter device of FIGS. 2, 3 and 4, assume that a sinusoidal signal of variable frequency is applied to the input terminal 22. Assume first for purposes of explanation that the lumped resistor R, in the n-type region 4 between contacts 16 and 20, is shorted so that ohmic contact 16 is directly connected to ohmic contact 20. As the frequency of the signal at input terminal 22 is increased, the portion of the applied signal which is passed through the semiconductive regions 4 and 6 to the conducting plate 16 will increase in accordance with the decreasing reactance of the capacitor, and ultimately a frequency will be reached at which substantially all of the signal passes through the dielectric, the effective impedance of the capacitor approaching zero, so that the filter would have the characteristics of a low-pass filter.

The explanation of the operation of the device may be simplified by making an analysis as if the device had lumped circuit parameters, in which portions of the signal applied to terminal 22 may follow three paths. In actuality, because of the distributed resistance and distributed capacitance of the monolith, each of these three paths consists of many paths, which may overlap in portions thereof. Assume now by the way of description that the internal lumped resistor R of the n-type region 4 is in the circuit, and that this resistor approaches the perfect resistor in that it has no substantial capacitance. These three paths are:

(1) A direct path for the signal is provided through the surface 14 of p-type region 6 between contact 10 and contact 12.

(2) A signal path is provided from contact 10 through region 6 and 4 to contact 16 along contact 16, and up through the semiconductive regions 4 and 6 to contact 12.

(3) A signal path is provided from contact 10 through the semiconductive regions 6 and 4 to contact 12 through the lumped resistor R to contact 20.

Figure 6:
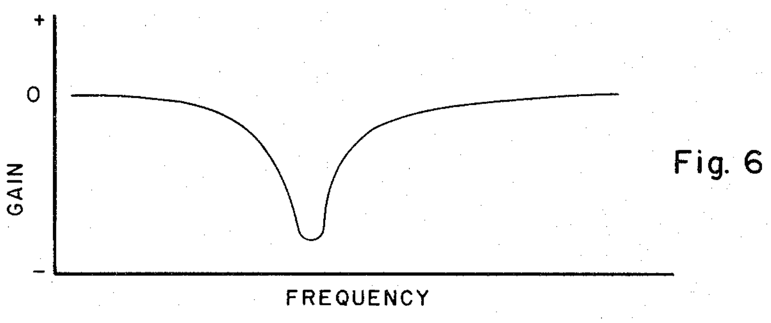
FIG. 6 is the gain versus frequency characteristic of the filter device.

Paths (2) and (3) are frequency responsive, and as the frequency of the signal is increased the impedance of the path (3) will constantly decrease with reference to the resistance of the first path through contacts 10 and 16, and the gain of the device will decrease as shown in the curve of FIG. 6 until the null is reached. At this point on the curve of FIG. 4, the voltage or signal at terminal 26 is substantially that resulting from signal division between contacts 10 and 12, and 10 and 20, resulting from the instant impedances of all paths. As the frequency is further increased, the resistance of the signal path (2) through the semiconductive regions established in parallel with the resistive current path between contacts 10 and 12, i.e. the path from terminal 22 through regions 6 and 4 to contact plate 16 and up through the regions 4 and 6 in the portion thereof adjacent contact 12, output terminal 26 becomes increasingly smaller so that the total effective impedance between contacts 10 and 16 further decreases, whereas the impedance of the path (3) which includes the resistor R remains substantially constant, causing the gain curve of FIG. 6 to increase in the manner shown. It will be seen that the null or notch filter effect is to some extent dependent upon the value of the resistance R.

Figure 7:
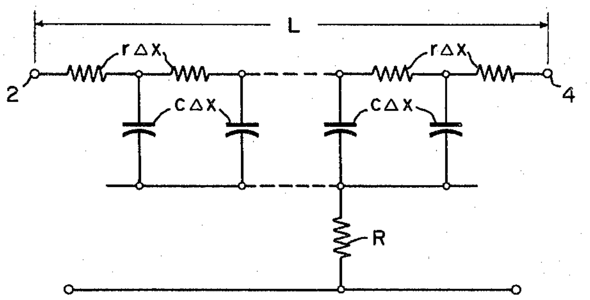
FIG. 7 is an equivalent circuit of the filter device.

Referring to FIG. 7, an equivalent circuit of the filter device of FIGS. 2, 3 and 4 is shown. The distance L is the distance between contacts 10 and 12 of FIG. 2. The U-shaped trough etched from surface 14 of device 2 and the notch 32 etched from the same surface are used to establish the boundaries of the RC filter network which is distributed within these bounds.

An analysis of the equivalent circuit may be made by methods similar to those discussed in an article entitled "Distributed Parameter Networks for Circuit Miniaturization," by Charles K. Hager, appearing in the Proceedings of the Joint Electronic Components Conference, I.R.E., A.I.E.E., May, 1959. In analyzing the circuit of FIG. 7, L is the length of the device as measured between ohmic contacts 10 and 12, FIG. 2; *r* and *c* are the resistance and capacitance per unit length. Mathematical analysis shows that the device will produce the effect of a notch filter with a true zero null under certain readily obtainable conditions. Utilizing nodal equations for one section of the circuit of FIG. 7 and taking the limit as $\Delta x \rightarrow 0$ will produce a system of partial differential equations. Computations can be simplified by ignoring resistance in series with the capacitors. However, the approximation has been shown to be held even when significant series resistance is present. Furthermore, assuming sinusoidal driving functions and expressing all time variation in terms of complex phasor notation, the partial differential equations reduce to second order ordinary differential equations. The solution for gain, the ratio of output to input voltage, under no-load condition is:

$$G\alpha\left(\frac{\omega}{\omega_1}\right)=\left|\operatorname{sech}\left[(1+j)\left(\frac{\omega}{\omega_1}\right)^{1/2}\right] + \frac{1-\operatorname{sech}\left[(1+j)\left(\frac{\omega}{\omega_1}\right)^{1/2}\right]}{1+\frac{\alpha}{(1+j)}\frac{1}{\left(\frac{\omega}{\omega_1}\right)^{1/2}}\coth\left[(1+j)\left(\frac{\omega}{\omega_1}\right)^{1/2}\right]}\right|$$

where $$\alpha=\frac{rL}{R}$$

and $$\omega_1=\frac{2}{L^2rc}$$

*r* is the distributed resistance per unit length,
*c* is the distributed junction capacitance per unit length,
L is the device length,
R is the lumped resistance in the n-type region 4 between contact 16 and contact 20,
$\omega$ is the angular frequency of the sinusoidal excitation.

It will be seen that the expression for gain given above is easily calculated as a function of two parameters $$\frac{\omega}{\omega_1}$$

and $\alpha$

The phase angle, $\phi$ is given by the formula $$\phi=\tan^{-1}\left(\frac{b}{a}\right)$$

where $$a=ReG$$
$$\alpha b=ImG\alpha$$

R*e* is the real part of G$\alpha$ and I*m* is the imaginary part of G$\alpha$, according to the above equation.

Figure 8:
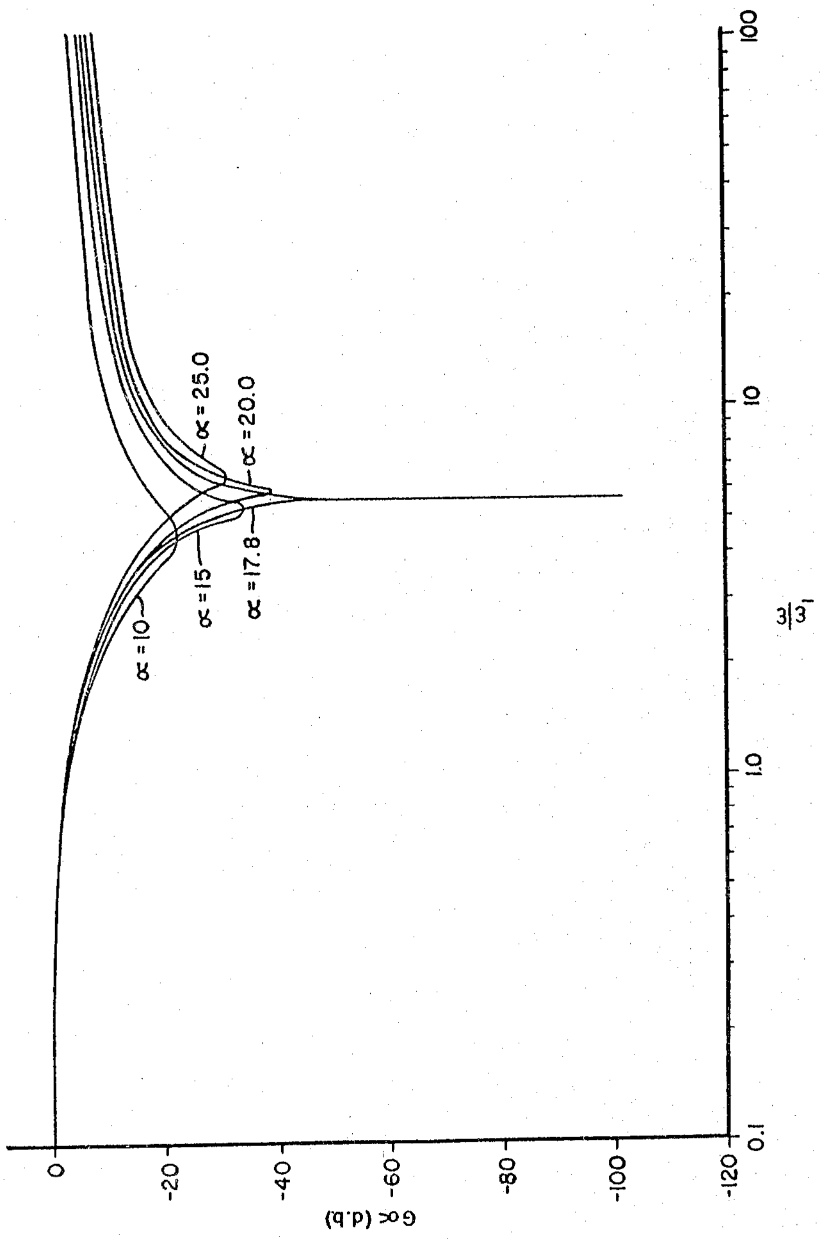
FIG. 8 is a theoretical plot of the frequency response of the filter device.

Particular reference should be made now to FIG. 8 where the response or gain measured in decibels is plotted as a function of frequency for various values of $\alpha$. The gain never exceeds unity.

The calculated curves indicate the $\alpha=17.8$ is very nearly optimum for no-load operation, providing the deepest null and the narrowest bandwidth. The null occurs at $$\frac{\omega}{\omega_1}=5.5935$$

The curves of FIG. 7 show then that the monolith structure of FIG. 5 has very desirable null characteristics while having a very simple structure. It can be shown that $$G\alpha_0\frac{\omega_0}{\omega_1}=0$$

where $$\alpha_0=2\left(\frac{\omega_0}{\omega_1}\right)^{1/2}\cosh\left(\frac{\omega_0}{\omega_1}\right)^{1/2}\sin\left(\frac{\omega_0}{\omega_1}\right)^{1/2};\left(\frac{\omega_0}{\omega_1}\right)$$

are the positive, odd-numbered solutions of $$-\tanh\frac{\omega_0{}^{1/2}}{\omega_1}=\tan\frac{\omega_0{}^{1/2}}{\omega_1}$$

The first intersection or solution is at $$\left(\frac{\omega_0}{\omega_1}\right)^{1/2}=2.3654,\ \alpha_0=17{,}786$$

Among the advantages provided by the instant invention over lumped parameter null circuits are particularly to be noted those which lie in fabrication techniques. The invention herein described may be simply created from an elementary semiconductor structure of very small size. Experimental tests of samples 500 mils long, 250 mils wide and 7 mils thick showed them to be operable in the 25 kc. to 6 megacycles range, with null frequencies adjustable over a factor of 2 with bias potentials from 1 to 16 volts, for example.

Another advantage of the semiconductor embodiments of the instant invention is the adjustability and tunability of the device. By changing the value or amplitude of the reverse bias potential, not shown, *c* can be changed without affecting *r* or the *r*/*R* ratio; therefore it is possible to alter the frequency at which the null occurs. Without the present design, application of reverse bias to the p-n junction could also change the value of the distributed resistance. This is undesirable because the $r/R$ ratio should remain substantially constant regardless of the value of the bias voltage.

In summary, the semiconductor embodiments of the invention provide novel circuit arrangements in which a surface resistance R, as part of the filter monolithic structure itself, is used in connection with distributed resistance and distributed capacitance of a reverse-biased p-n semiconductor junction to obtain null or "notch filter" circuit performance.

Although the present invention has been described with a certain degree of particularity, it should be understood that the present disclosure has been made only by way of example and that numerous changes in the details of construction and the combination and arrangements of parts may be resorted to without departing from the scope and spirit of the present invention.

We claim as our invention:

1. A narrow band rejection filter device comprising a single monolithic crystal of semiconductor material having a first region of one type of semi-conductivity and a second region of a second type of semiconductivity, said regions being in juxtaposed relation providing a rectifying p-n junction, said second region extending beyond the area of said junction, first and second ohmic contacts spaced apart a selected distance on the outer surface of said first region providing a resistive current path of selected resistive impedance, said resistive path in cooperation with said junction forming a distributed capacitance, said first region being highly doped with impurity concentration rapidly decreasing with depth from the outer surface, said second region being lightly doped with impurities substantially uniformly distributed in said second region, a third ohmic contact on the outer side of said second region and being substantially coextensive in area with said p-n junction, said third ohmic contact serving, effectively, as a common terminal for the distributed capacitance and for one end of a non-distributed resistive impedance constituted by said extension on said second region, and a fourth ohmic contact on said second region separated from said third ohmic contact, said first region being proportioned to provide a selected ratio of distributed resistive impedance between said first and second contacts to the non-distributed resistive impedance between said third and fourth contacts which is substantially 17.79:1 to provide a selected null frequency which will be a function of the distributed resistance and capacitance and the length of the electrical path between said first and second ohmic contacts.

2. A narrow band rejection filter device comprising a single monolithic crystal of semiconductor material having a first region of one type of semiconductivity and a second region of the opposite type of semiconductivity, said regions being in juxtaposed relation providing a rectifying p-n junction, first and second ohmic contacts spaced apart a selected distance on the outer surface of said first region providing a resistive current path of selected distributed resistive impedance between said third and fourth junction forming a distributed capacitance, a third ohmic contact on the outer side of said second region opposite said p-n junction and a fourth ohmic contact on said second region separated from said third ohmic contact and so proportioned as to provide a selected non-distributed resistive impedance between said third and fourth ohmic contacts, one of said ohmic contacts on said first region constituting an input terminal and the other ohmic contact on said first region constituting an output terminal, said fourth ohmic contact constituting a common input-output terminal, and circuit means including adjustable reverse biasing means connected between one of said terminals on said first region and one of said terminals on said second region for varying the distributed resistance and capacitance between said input and output terminals, whereby the notch frequency of the filter is determined and may be varied.

3. A narrow band rejection filter comprising a single monolithic crystal of semiconductor material having a first region of one type of semiconductivity and a second region of the opposite type of semiconductivity, said region being in juxtaposed relation providing a rectifying p-n junction, first and second ohmic contacts spaced apart a selected distance on the outer surface of said first region providing a resistive current path of selected distributed resistance and in cooperation with said junction forming a distributed capacitance, a third ohmic contact on the outer surface of said second region, said third ohmic contact being substantially coextensive in area with said p-n junction thereby effectively serving as a common terminal for the distributed capacitance, a fourth ohmic contact on said second region separated from said third ohmic contact whereby the portion of said second region electrically between said third and fourth contacts provides a selectable non-distributed resistive impedance, one of said ohmic contacts on said first region constituting an input terminal and the other ohmic contact on said region constituting an output terminal, said fourth ohmic contact constituting a common input-output terminal, and circuit means including adjustable reverse biasing means connected between one of said terminals on said first region and one of said terminals on said second region for varying the distributed resistance and capacitance between said input and output terminals, whereby the notch frequency of the filter is determined and may be varied.

4. A narrow band rejection filter device comprising a single monolithic crystal of semiconductor material having a first region of one type of semiconductivity and a second region of the opposite type of semiconductivity, said first region having an impurity density progressively decreasing in density with depth toward said junction, said second region being lightly doped with substantially uniform impurities throughout its depth, said first and second regions being in juxtaposed relation providing a rectifying p-n junction, said first and second ohmic contacts spaced apart a selected distance on the outer surface of said first region, said first region being proportioned to provide a resistive current path of selected distributed resistance between said first and second ohmic contacts, and in cooperation with said junction forming a distributed capacitance, a third ohmic contact on the outer side of said second region, said third ohmic contact being substantially coextensive in area with said p-n junction, a fourth ohmic contact on said second region separated from said third ohmic contact, said third ohmic contact serving, effectively, as a common terminal for the distributed capacitance and for one end of the non-distributed resistive impedance selectively provided between said third and fourth ohmic contacts, one of said ohmic contacts on said first region constituting an input terminal and the other ohmic contact on said first region constituting an output terminal, said fourth ohmic contact constituting a common input-output terminal, and circuit means including adjustable reverse biasing means connected between one of said terminals on said first region and one of said terminals on said second region for varying the distributed resistance and capacitance between said input and output terminals, whereby the notch frequency of the filter is determined and may be varied.

5. A narrow band rejection filter device comprising a single monolithic crystal of semiconductor material having a first region of one type of semiconductivity and having an impurity density progressively decreasing with distance from its outer surface, a second region of the opposite type of semiconductivity, said second region being lightly doped with uniformly distributed impurities, said regions being in juxtaposed relation providing a rectifying p-n junction, said first and second ohmic contacts being spaced apart a selected distance on the outer surface of said first region, the spacing of said first and second contacts and the proportioning of the intervening portion of said first region providing a resistive current path of selected distributed resistive impedance and in cooperation with said junction forming a distributed capacitance, said second region extending beyond the area of said junction, a third ohmic contact on the outer surface of said region of opposite semiconductivity and being substantially coextensive in area with said p-n junction, said third ohmic contact serving, effectively, as a common terminal for the distributed capacitance, a fourth ohmic contact on the extension of said region of opposite semiconductivity, whereby a portion of the latter region between said third and fourth contacts provides a selected non-distributed resistive impedance which can be selectively varied without altering the distributed capacitance, one of said ohmic contacts on said first region constituting an input terminal and the other ohmic contact on said first region constituting an output terminal, said fourth ohmic contact constituting a common input-output terminal, and circuit means including adjustable reverse biasing means connected between one of said terminals on said first region and one of said terminals on said second region for varying the distributed resistance and capacitance between said input and output terminals, whereby the notch frequency of the filter is determined and may be varied.

6. A narrow band rejection filter device comprising a single monolithic crystal of semiconductor material having a first region of one type of semiconductivity and a second region of the opposite type of semiconductivity, said regions being in juxtaposed relation providing a rectifying p-n junction, said first region being highly doped with an impurity concentration rapidly decreasing with depth from the outer surface of said region toward said junction, said second region being lightly doped with impurities substantially uniformly distributed throughout said second region, said first and second ohmic contacts spaced apart a selected distance on the outer surface of said first region providing a resistive current path of selected distributed resistance which can be altered by altering the thickness of said first region between said first and second contacts, a third ohmic contact on the outer side of said second region covering a substantial portion of the area of said region and effectively serving as a common terminal for the distributed capacitance, a fourth ohmic contact on said second region separated from said third ohmic contact, one of said ohmic contacts on said first region constituting an input terminal and the other ohmic contact on said first region constituting an output erminal, said fourth ohmic contact constituting a common input-output terminal, the portion of the second region between said third and fourth contacts providing a selected nondistributed resistive impedance which bears a selected ratio to said distributed resistance between said first and second ohmic contacts, and circuit means including adjustable reverse biasing means connected between one of said terminals on said first region and one of said terminals on said second region for varying the distributed resistance and capacitance between said input and output terminals, whereby the notch frequency of the filter is determined and may be varied.

References Cited by the Examiner

UNITED STATES PATENTS

| | | | |
|---|---|---|---|
| 2,553,491 | 5/51 | Shockley | 333—72 |
| 2,570,978 | 10/51 | Pfann | 330—70 |
| 2,655,607 | 10/53 | Reeves | 307—88.5–6 |
| 2,744,970 | 5/56 | Shockley | 330—70 |
| 3,022,472 | 2/62 | Tannenbaum et al. | 333—18 |
| 3,060,327 | 10/62 | Dacey | 307—88.5–11 |
| 3,061,739 | 10/62 | Stone | 307—88.5 |

OTHER REFERENCES

Hager: "Network Design of Microcircuits," published in Electronic, vol. 32, No. 36, pp. 44–49.

Herwald et al.: "Integration of Circuit Functions Into Solids," Science, vol. 132, Oct. 21, 1960, pp. 1127–1133 relied upon.

Kaufman: Proc. IRE, September 1960, "Theory of Null Devices," pp. 1540–1543.

HERMAN KARL SAALBACH, *Primary Examiner.*

RUDOLPH V. ROLINEC, *Examiner.*